United States Patent

Blowers

[15] 3,703,651

[45] Nov. 21, 1972

[54] TEMPERATURE-CONTROLLED INTEGRATED CIRCUITS

[72] Inventor: William L. Blowers, Newburgh, N.Y.

[73] Assignee: Kollmorgen Corporation, Hartford, Conn.

[22] Filed: July 12, 1971

[21] Appl. No.: 161,512

[52] U.S. Cl...................................307/310, 307/297

[51] Int. Cl.................................................H01l 1/24

[58] Field of Search...........307/310, 297; 317/235 Q; 330/23

[56] References Cited

UNITED STATES PATENTS

| | | | |
|---|---|---|---|
| 3,308,271 | 3/1967 | Hilbiber | 317/235 Q X |
| 3,393,870 | 7/1968 | Jeffrey | 307/310 |
| 3,395,265 | 7/1968 | Weir | 317/235 Q X |
| 3,321,629 | 5/1967 | Hobrough | 307/297 X |
| 3,567,965 | 3/1971 | Weinerth et al. | 317/235 Q |

*Primary Examiner*—Herman Karl Saalbach
*Assistant Examiner*—B. P. Davis
*Attorney*—Frederick E. Bartholy

[57] ABSTRACT

An integrated circuit comprising several transistors on a chip is maintained at a constant temperature by utilizing certain of the transistors as heating elements and other transistors as temperature sensors in a closed loop feedback network. The remaining transistors—not thus utilized for temperature regulation and sensing are available for use in work circuits where sensitivity to ambient temperature variations or self-heating present design problems.

2 Claims, 3 Drawing Figures

INVENTOR
WILLIAM L. BLOWERS
BY Frederick W. Gaither [signature]
ATTORNEY

INVENTOR
WILLIAM L. BLOWERS
BY Frederick E. Bartholy
ATTORNEY

TEMPERATURE-CONTROLLED INTEGRATED CIRCUITS

FIELD OF THE INVENTION

This invention relates to integrated circuits and it has reference in particular to controlling the temperature of integrated circuit chips. It enables the design of precision work circuits such as logarithmic converters or for producing precise reference voltages which will be unaffected by ambient temperature changes over a relatively wide range.

DESCRIPTION OF THE PRIOR ART

Temperature control of circuit elements, the precision of which is affected either by ambient temperature changes or temperature changes caused by current flow in the circuit element itself, has heretofore been obtained by enclosing the circuit components in an insulated oven or container requiring expensive cooling controls as well as heating controls. Other circuits have been designed but do not offer the economies as herein described.

SUMMARY OF THE INVENTION

Generally stated, it is the primary object of this invention to provide a novel circuit configuration for controlling the temperature of integrated circuit elements.

More specifically, it is an object of the invention to provide an improved integrated circuit element practically unaffected by ambient temperature changes.

It is a particular feature of the invention that use is made of one or more transistors of a plurality of transistors on a chip or substrate for regulating the temperature of the chip and hence the temperature of the remaining transistors.

Another feature of the invention is that use is made of certain transistors on an integrated circuit chip for regulating the temperature of the chip, so that the other transistors on the chip may be used in precision measuring circuits where temperature variations are apt to introduce errors in the measurements.

A further object of the invention is to provide for regulating the temperature of a silicon chip by using certain transistors on the chip to sense the temperature thereof and to control the current through one or more of the transistors used as heating elements for the chip.

Other objects, features and advantages will be apparent from the following description of the invention, defined in particularity in the appended claims, and taken in connection with the accompanying drawings, in which:

DESCRIPTION OF A PREFERRED EMBODIMENT

It has been shown in the prior art in an article by R. J. Widlar, titled "An Exact Expression for the Thermal Variation of the Emitter Base Voltage of Bi-Polar Transistors," *National Semiconductor Technical Paper TP*–1 (1967), that the base emitter voltage of a silicon bi-polar transistor has many useful and predictable characteristics. One of these is that the voltage varies in a linear manner as a function of temperature. If the base emitter current is held constant, this voltage changes approximately $-2.4 \times 10^{-3}$ volts per degree centigrade over a broad temperature range. Thus such a transistor can be used as a fairly accurate measure of temperature.

Figure 1:
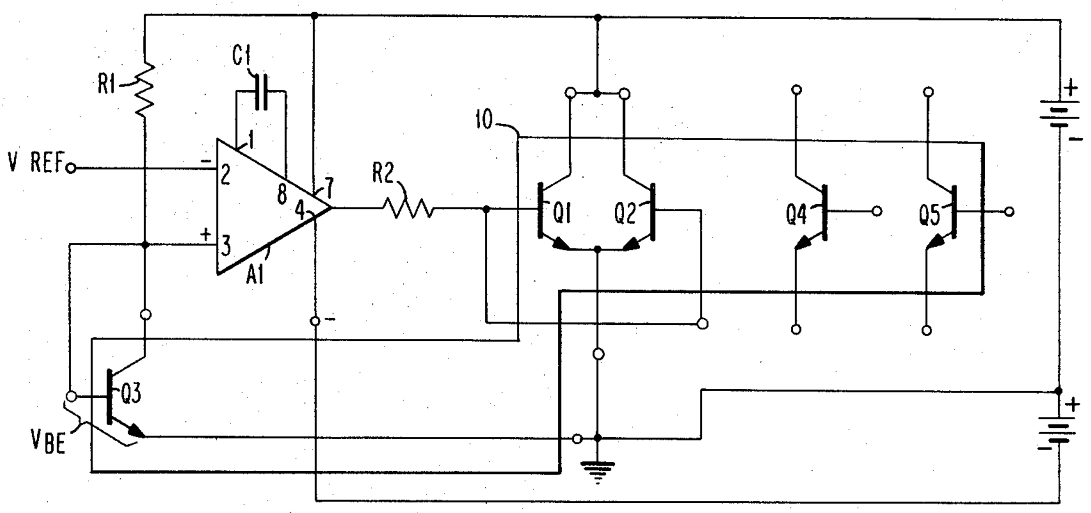
FIG. 1 is a schematic circuit diagram showing an integrated circuit chip having a plurality of transistors thereon with certain of the transistors connected in accordance with the present invention.

Transistor arrays containing, for example, five NPN bi-polar transistors manufactured by using integrated circuit techniques are readily available commercially. Certain of these products are designated as the CA3045, CA3046, and the SG3821, respectively. One of such arrays is schematically shown in FIG. 1, containing transistors Q1 to Q5 on a single silicon chip 10. In practice, such chips are extremely small in physical size, being no more than 50×50 mils, and therefore have substantially the same temperature throughout. Since the transistors are all integrated circuit devices, they possess almost identical characteristics and can be considered to be precisely matched to each other.

By utilizing one or more of these transistors as heating elements, the entire integrated circuit chip can be raised in temperature to a safe maximum of 70° C. for the CA3046 and SG3821, and to a maximum of 150° for the CA3045. If one or more of the transistors is connected as a diode by shorting its base and collector, as shown (Q3), it can be used as a chip temperature sensor. If the sensor and heater transistors are placed in a suitable feedback network, the chip temperature can be held constant within ±0.5° C.

As can be seen from FIG. 1, transistors Q1 and Q2 in a common emitter configuration, are connected directly between the power supply terminal and ground. By virtue of the collector-emitter current flow these are used as heating elements to heat the integrated circuit chip 10 to the desired temperature. Transistor Q3 with its base and collector shorted, is diode-connected and is biased by resistor R1. Thus Q3 acts as the temperature sensor. An operational amplifier A1 is used to compare the base emitter voltage across transistor Q3 (VBE) with a reference voltage V Ref. The output of the amplifier A1 is connected to the base of transistor Q1 and Q2 through resistor R2.

The operation is as follows: Assuming that (VBE) is more positive than V Ref., the operational amplifier A1 will increase its output in the positive direction and cause base current to flow through R2 into transistors Q1 and Q2. This base current in turn produces a collector current flow in transistors Q1 and Q2. Since Q1 and Q2 are connected directly to the power supply, this current will cause the transistors to dissipate power and thereby raise the temperature of the integrated circuit chip 10. As the temperature of the chip rises, the base emitter voltage (VBE) of Q3 decreases, causing the output of the amplifier A1 to decrease until VBE becomes equal to the reference voltage V Ref. Once this condition has established itself, the operational amplifier A1 will drive transistors Q1 and Q2 with just enough current to maintain the temperature of the chip 10 at a desired fixed value. This temperature will remain substantially constant as the ambient temperature increases and decreases; thus precise temperature control is accomplished.

The range of ambient temperature over which control can be exercized is limited by the following factors:

1. The highest temperature permissible is determined by the maximum allowable temperature at which the integrated circuit can function without being destroyed by over-dissipation. This is approximately 70° C. for the CA3046 and SG3821, and 150° C. for the CA 3045.

2. The lowest temperature is determined by the current handling capabilities of the integrated circuit chip. As the ambient temperature decreases, more and more current flows in transistor Q1 and Q2 to keep the chip at a constant temperature. At some temperature the transistors would reach a saturation level and the current would no longer increase.

3. Another limiting factor is, of course, the operational amplifier A1 which has temperature limits which must be taken into consideration.

It will be seen in FIG. 1 that transistors Q4 and Q5 are a part of the integrated circuit chip 10 which has its temperature regulated. These transistors may be used in any work circuit, particularly one requiring precise temperature conditions, both absolute and relative to each other. Tests indicate that the absolute temperature can be held to 0.5° C. and the degree of temperature match between the transistors to 0.05° C. over an ambient temperature change of 48° C. This translates into a base emitter voltage stability of 1.2 mv as compared with 115 mv without regulation.

The time required to react to a sudden change in ambient temperature is exceedingly small. To reach 90 percent of any desired temperature has been found to be on the order of $20 \times 10^{-3}$ seconds.

An example of useful application of the invention is in a log to linear converter circuitry as used in densitometric instruments. Most densitometers employ a PM (photomultiplier) tube in a dynode feedback circuit. Correction must be made in the dynode voltage in order to produce proper linearity in density measurements. In the past this has been done with compensating potentiometers as shown, for example, in U.S. Pat. No. 2,492,901 to M. H. Sweet. It has been found through testing of several PM tubes that a log amplifier of the type herein described will eliminate the need for linearity correcting networks.

It is a characteristic of log-linear converters constructed with bi-polar transistors that they exhibit a 0.3%/° C. drift per log. In the densitometer application referred to, the range of the dynode voltage is just under one log, and if no correction for this temperature sensitivity were made, the densitometer would drift 0.15 density per degree centigrade. By maintaining the chip at a constant temperature as described hereinbefore, this drift of 0.3%/° C. can be reduced to a drift of 0.0033%/° C. This improved situation results in a conversion stability for the log converter which translates into a drift of 0.0015 density per centigrade with ambient temperature changes.

Figure 3:
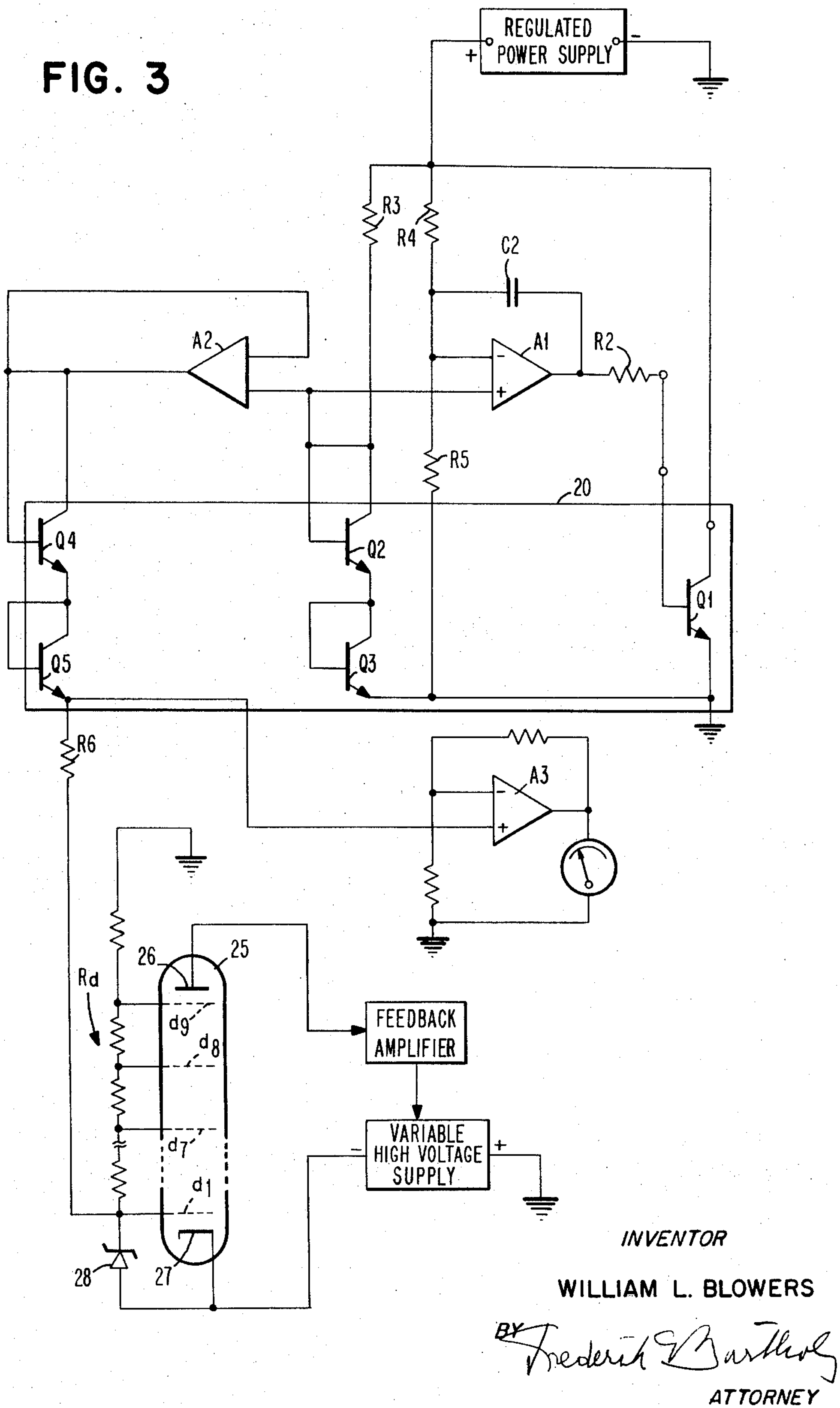
FIG. 3 is a schematic circuit diagram showing an integrated circuit chip with a plurality of transistors, some of which are connected to regulate the temperature of the chip in accordance with the invention and others in a work circuit to effect linearity of response in a photomultiplier circuit.

Referring to FIG. 3, there is shown a complete log-linear converter in combination with a conventional photomultiplier tube circuit intended for the measurement of density. The temperature regulation of the chip 20 is rearranged from that of FIG. 1 for the sake of convenience. The heating transistor is Q1 and connects between the positive terminal of the power supply and ground. It is to be noted that the power supply is of the regulated type in order to maintain a constant voltage inasmuch as it is used also as the reference voltage source for the operational amplifier A1. One input of the amplifier connects to the junction point of resistors R4 and R5 which serve as a voltage divider between ground and the power supply. The reference voltage is at this junction point. Depending upon design requirements, separate power supplies may be provided for the heating transistor Q1 and for the reference voltage.

Temperature sensor transistors Q2 and Q3 are diode-connected and placed in series between ground and the positive side of the supply through a resistor R3. The junction point of resistor R3 and the interconnected base and collector of Q2 connects to the second input of amplifier A1. Capacitor C2 acts as a stabilizing component to prevent oscillations. The base of Q1 is driven from the output of the amplifier A1 through the series resistor R2.

The circuit functions in the same manner as that shown in FIG. 1. The chip 20 is raised to the required temperature and changes in the base emitter voltage of Q2 and Q3 are compared to the reference voltage. Amplifier A1 completes the feedback loop and controls the current in the heating transistor Q1 in accordance with the operation of the sensor transistors Q2 and Q3.

The remaining transistors Q4 and Q5 are used in a work circuit, in this instance as log conversion elements to correct the dynode voltage change in the photomultiplier circuit of a densitometer to represent densitometric units. The latter is of a conventional type, including the PM tube 25, having anode 26, cathode 27, and a plurality of dynode elements $d_1$ to $d_9$. For the sake of simplfying the illustration, only four dynode elements are shown instead of the actual nine. It is to be understood that the dynodes are interconnected by suitable resistors, forming a resistor network Rd between ground and the dynode 1 which connects to the cathode 27 through a Zener diode 28. The power supply and the conventional feedback circuit are shown by block diagram. The output from the photomultiplier tube is taken from the dynode 1.

The log conversion circuit comprises diode-connected transistors Q4 and Q5 and an amplifier A2 utilized as a voltage follower. The latter acts as an impedance buffer between the temperature regulating circuit and transistors Q4 and Q5. The output of the PM tube at dynode 1 connects to the emitter of Q5 through coupling resistor R6 and to the input of amplifier A3 which operates as a non-inverting amplifier. The output thereof connects to an indicating meter which has a linear scale and is generally calibrated in units representing density.

As the dynode voltage applied to the emitter of Q5 changes, it produces a current change through transistors Q4 and Q5. This change in current causes a corresponding change in the base-emitter voltage and this voltage changes as the log of the current. Therefore, transistors Q4 and Q5 function as linear to log converters. Two transistors are connected in series to provide a greater change in VBE for a given change in current. As has been said hereinbefore, this circuit operates over a limited dynamic range, and by stacking transistors Q4 and Q5 in series, the effective change in base-emitter voltage for a given change in current is doubled. This places less stringent requirements on the amplifiers which follow in the circuit.

Figure 2:
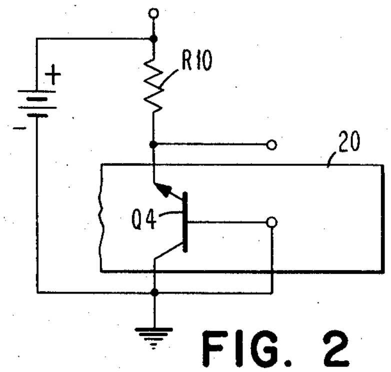
FIG. 2 is a schematic circuit showing a transistor connected to function as Zener diode.

Another application of the integrated circuit temperature control would be in providing a stable reference voltage for use in various circuits. The circuit arrangement of FIG. 1 or FIG. 3 may be used to heat the integrated circuit chip 20 (FIG. 2) and to sense the temperature thereof. Instead of using both of the transistors Q4, Q5 as log elements, one them, Q4, for example, is diode-connected, the base and the collector being shorted together, and the transistor Q4 is reverse biased by connecting the emitter to the positive terminal of the supply through a resistor R10, causing the base-emitter junction to operate as a Zener diode. The output from this Zener diode can be used as a reference voltage. The advantage is that the Zener voltage is temperature stable regardless of the current through the Zener junction. As should be known by those familiar with temperature compensated Zener diodes, a broad envelope of temperature drift exists even among so-called temperature compensated devices. Since temperature variations are eliminated by the present invention, this envelope is eliminated and good stability can be achieved on a volume basis without the expensive drawback of device selection and circuit tailoring. In a practical application, this circuit has exhibited a stability of 5 mv when a temperature change of as much as 50° C. takes place. The Zener voltage at the time of test was 7 volts.

A low voltage reference source can be obtained in a similar fashion by operating the transistor as a forward-biased diode on a temperature regulated chip. The voltages available with this technique would be 0.6 v., 1.2 v., 1.8 v., or 2.4 v.

The invention in its broader aspects is not limited to the specific embodiment herein shown and described but changes may be made within the scope of the accompanying claims without departing from the principles of the invention and without sacrificing its chief advantages.

What is claimed is:

1. The combination with an integrated circuit device having a plurality of transistors on a common chip, of circuit means connecting one pair of said transistors in a common emitter configuration to a source of electrical energy for heating said chip, additional circuit means connecting other of said transistors to control the conductivity of said heating transistors, thereby to maintain said chip at a substantially constant temperature, the control of the conductivity of the heating transistors including a diode-connected temperature sensor transistor and a feedback loop comprising an amplifier having a dual input, one of said inputs being energized by a reference voltage and the other by the base-emitter voltage of said temperature sensor transistor, the output of said amplifier being connected to the base electrode of said heating transistors, the remaining transistors being useable for various work circuits.

2. The circuit as defined in claim 1 characterized by one of said work circuit transistors being diode-connected by interconnecting the emitter with the base and reverse-biased by having its collector connected to the source through a resistor to provide a temperature regulated Zener reference voltage at said collector for connection to the reference input circuit of said amplifier.

* * * * *